United States Patent  
Sekijima (10) Patent No.: US 12,438,074 B2
(45) Date of Patent: Oct. 7, 2025

(54) SEMICONDUCTOR APPARATUS (71) Applicant: SHINKO ELECTRIC INDUSTRIES CO., LTD., Nagano (JP)

(72) Inventor: Shinichiro Sekijima, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 463 days.

(21) Appl. No.: 17/809,086

(22) Filed: Jun. 27, 2022

(65) Prior Publication Data
US 2023/0005830 A1    Jan. 5, 2023

(30) Foreign Application Priority Data

Jun. 30, 2021  (JP) ................. 2021-108392

(51) Int. Cl.
H01L 23/498    (2006.01)
H01L 21/56     (2006.01)
(Continued)

(52) U.S. Cl.
CPC ........ H01L 23/49833 (2013.01); H01L 21/56 (2013.01); H01L 23/3128 (2013.01);
(Continued)

(58) Field of Classification Search
CPC ........... H01L 23/49833; H01L 23/3128; H01L 24/16; H01L 24/32; H01L 24/73;
(Continued)

(56) References Cited

U.S. PATENT DOCUMENTS

2008/0179738 A1    7/2008  Nishimura et al.
2008/0251283 A1    10/2008  Araki
(Continued)

FOREIGN PATENT DOCUMENTS

JP    2008-159911    7/2008
JP    2008-187054    8/2008
(Continued)

OTHER PUBLICATIONS

Office Action mailed on Nov. 19, 2024 with respect to the corresponding Japanese patent application No. 2021-108392.
(Continued)

Primary Examiner — Peniel M Gumedzoe
(74) Attorney, Agent, or Firm — IPUSA, PLLC (57) ABSTRACT A semiconductor apparatus includes a first substrate having a first major surface and a plurality of first conductive pads on the first major surface, a second substrate having a second major surface opposing the first major surface, and having a plurality of second conductive pads on the second major surface, a semiconductor device disposed between the first substrate and the second substrate and mounted on the first major surface of the first substrate, and a plurality of bonding members that bond the first conductive pads and the second conductive pads together, wherein in a plan view normal to the first major surface, the first substrate has a rectangular plane shape with a first side and a second side each extending parallel to a first direction, and a third side and a fourth side each extending parallel to a second direction perpendicular to the first direction.

3 Claims, 9 Drawing Sheets (51) Int. Cl.
  *H01L 23/31*    (2006.01)
  *H01L 23/00*    (2006.01)
(52) U.S. Cl.
  CPC .............. *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01)
(58) Field of Classification Search
  CPC . H01L 2224/16227; H01L 2224/32225; H01L 2224/73204
  See application file for complete search history.

(56) References Cited

U.S. PATENT DOCUMENTS

| | | | |
|---|---|---|---|
| 2009/0008765 | A1 | 1/2009 | Yamano et al. |
| 2012/0091597 | A1* | 4/2012 | Kwon ..................... H01L 23/48 257/777 |
| 2014/0231984 | A1* | 8/2014 | Chen ....................... H01L 25/50 257/737 |
| 2017/0221829 | A1* | 8/2017 | Shiraki ................. H01L 21/565 |
| 2020/0043854 | A1* | 2/2020 | Oh ........................... H01L 24/16 |
| 2021/0320067 | A1* | 10/2021 | Kim .................... H01L 23/49838 |
| 2022/0352058 | A1* | 11/2022 | Lee .......................... H01L 23/16 |

FOREIGN PATENT DOCUMENTS

| | | |
|---|---|---|
| JP | 2016-009740 | 1/2016 |
| WO | 2007/069606 | 6/2007 |

OTHER PUBLICATIONS

Office Action mailed on Mar. 25, 2025 with respect to the corresponding Japanese patent application No. 2021-108392.

* cited by examiner

SEMICONDUCTOR APPARATUS

CROSS-REFERENCE TO RELATED APPLICATIONS

The present application is based upon and claims the benefit of priority from the prior Japanese Patent Application No. 2021-108392 filed on Jun. 30, 2021, with the Japanese Patent Office, the entire contents of which are incorporated herein by reference.

FIELD

The disclosures herein relate to semiconductor apparatuses.

BACKGROUND

A semiconductor apparatus having a semiconductor chip provided between the upper substrate and lower substrate thereof is known in the art (see Patent Document 1).

Although the semiconductor apparatus disclosed in Patent Document 1 achieves its intended purpose, there is a risk of warping or waving in the semiconductor apparatus depending on the shape of the semiconductor chip, as the shape of semiconductor chips is diversified.

It may be an object of the present disclosures to provide a semiconductor apparatus for which the occurrence of warping and waving can be reduced.

[Patent Document 1] International Publication Pamphlet No. WO2007/069606

SUMMARY

According to an aspect of the embodiment, a semiconductor apparatus includes a first substrate having a first major surface and a plurality of first conductive pads on the first major surface, a second substrate having a second major surface opposing the first major surface, and having a plurality of second conductive pads on the second major surface, a semiconductor device disposed between the first substrate and the second substrate and mounted on the first major surface of the first substrate, and a plurality of bonding members that bond the first conductive pads and the second conductive pads together, wherein in a plan view normal to the first major surface, the first substrate has a rectangular plane shape with a first side and a second side each extending parallel to a first direction, and a third side and a fourth side each extending parallel to a second direction perpendicular to the first direction, the semiconductor device has a rectangular plane shape with a fifth side and a sixth side each extending parallel to the first direction, and a seventh side and an eighth side each extending parallel to the second direction, the fifth side and the sixth side are longer than the seventh side and the eighth side, the fifth side is closer to the first side than is the sixth side, the seventh side is closer to the third side than is the eighth side, part of the bonding members are arranged in two or more first rows extending parallel to the first direction between the first side and the fifth side, part of the bonding members are arranged in two or more second rows extending parallel to the first direction between the second side and the sixth side, part of the bonding members are arranged in one or more third rows extending parallel to the second direction between the third side and the seventh side, part of the bonding members are arranged in one or more fourth rows extending parallel to the second direction between the fourth side and the eighth side, and a number of rows in the third rows and a number of rows in the fourth rows are each less than both a number of rows in the first rows and a number of rows in the second rows.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, the embodiment will be described with reference to the accompanying drawings. In the specification and drawings, elements having substantially the same functions or configurations are referred to by the same numerals, and a duplicate description thereof may be omitted. In the present disclosures, the X1-X2 direction, the Y1-Y2 direction, and the Z1-Z2 direction are orthogonal to each other. A plane that includes the X1-X2 direction and the Y1-Y2 direction is referred to as an XY plane. A plane that includes the Y1-Y2 direction and the Z1-Z2 direction is referred to as a YZ plane. A plane that includes the Z1-Z2 direction and the X1-X2 direction is referred to as a ZX plane. For the sake of convenience, the Z1-Z2 direction is referred to as a vertical direction. Also, the Z1 side is referred to as an upper side, and the Z2 side is referred to as a lower side. A "plan view" refers to a view of an object as taken from the Z1 side. A "plane shape" refers to the shape of an object as appears when viewed from the Z1 side. It may be noted, however, that a semiconductor apparatus may be used in an upside-down position, or may be placed at any angle.

Figure 1:
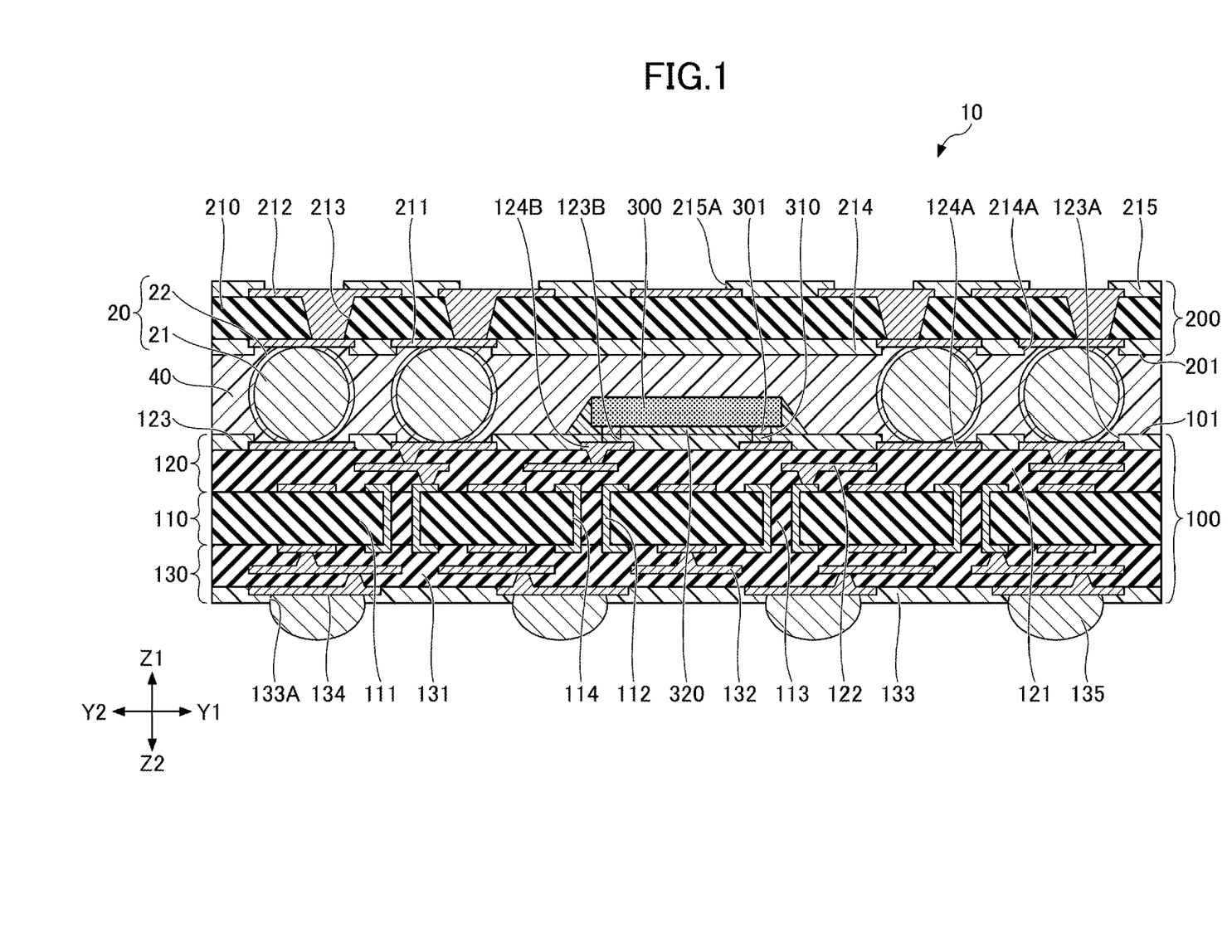
FIG. 1 is a cross-sectional view illustrating a semiconductor apparatus according to an embodiment.

The present embodiment is directed to a semiconductor apparatus. FIG. 1 is a cross-sectional view illustrating a semiconductor apparatus according to the embodiment.

The semiconductor apparatus 10 according to the embodiment includes a lower substrate 100, an upper substrate 200, and a semiconductor device 300. The lower substrate 100 has an upper surface 101 substantially parallel to an XY plane, and the upper substrate 200 has a lower surface 201 substantially parallel to an XY plane. The upper substrate 200 is disposed on the upper side (Z1 side) of the lower substrate 100. The lower surface 201 of the upper substrate 200 faces the upper surface 101 of the lower substrate 100. The lower substrate 100 is an example of a first substrate, and the upper substrate 200 is an example of a second substrate. The upper surface 101 of the lower substrate 100 is an example of a first major surface, and the lower surface 201 of the upper substrate 200 is an example of a second major surface.

The lower substrate 100 includes, for example, a core layer 110, a build-up layer 120 provided on the upper surface of the core layer 110, and a build-up layer 130 provided on the lower surface of the core layer 110. The lower substrate 100 may be a core-less substrate that does not include a core layer.

The core layer 110 includes an insulating substrate 111 with through-holes 114 formed therethrough, through-electrodes 112 formed on the inner wall surface of the through-holes 114, and a filler material 113 filling the inside of the through-electrodes 112. The material of the core layer 110 may be glass epoxy or the like, and the material of the through-electrodes 112 may be copper or the like, for example. Alternatively, the filler material 113 may not be provided, and the through-electrodes 112 having the inside of the through-holes 114 filled with metal may be used.

The build-up layer 120 includes insulating layers 121, interconnect layers 122, and a solder resist layer 123. The solder resist layer 123 has openings 123A for connection to the upper substrate 200 and openings 123B for mounting the semiconductor device 300. The interconnect layers 122 includes, on the uppermost surface of the insulating layers 121, a plurality of conductive pads 124A for connection to the upper substrate 200, and a plurality of conductive pads 124B for mounting the semiconductor device 300. The conductive pads 124A are exposed in the openings 123A and the conductive pads 124B are exposed in the openings 123B. An example of the material of the interconnect layers 122 is a conductor such as copper. The conductive pads 124A are an example of first conductive pads.

The build-up layer 130 includes insulating layers 131, interconnect layers 132, and a solder resist layer 133. The solder resist layer 133 has openings 133A for external connection. The interconnect layers 132 include conductive pads 134 on the lowermost surface of the insulating layers 131. The conductive pads 134 are exposed in the openings 133A. An example of the material of the interconnect layers 132 is a conductor such as copper. Solder balls 135 are provided on the conductive pads 134. It may be noted that, in some cases, the solder balls 135 may not be provided, and the conductive pads 134 may directly be connected to the electrodes of an external apparatus.

The conductive pads 124A, the conductive pads 124B, and the conductive pads 134 are electrically connected via the interconnect layers 122, the through-electrodes 112, and the interconnect layers 132. The number of insulating layers 121 and interconnect layers 122 included in the build-up layer 120 and the number of insulating layers 131 and interconnect layers 132 included in the build-up layer 130 are not limited to particular numbers.

The semiconductor device 300 is flip-chip mounted on the upper surface 101 of the lower substrate 100. In other words, the bumps 301 of the semiconductor device 300 are electrically connected to the conductive pads 124B of the lower substrate 100 via bonding material 310. The bonding material 310 is made of a solder, for example. An underfill material 320 fills the gap between the semiconductor device 300 and the lower substrate 100.

The upper substrate 200 includes, for example, a core layer 210, a plurality of conductive pads 211, a plurality of conductive pads 212, a solder resist layer 214, and a solder resist layer 215. The upper substrate 200 may be a core-less substrate, which does not include a core layer.

The conductive pads 211 are provided on the lower surface of the core layer 210, and the conductive pads 212 are provided on the upper surface of the core layer 210. The conductive pads 212 are connected to the conductive pads 211 through via holes 213 formed through the core layer 210. An example of the material of the conductive pads 211 and the conductive pads 212 is a conductor such as copper. The conductive pads 211 are an example of second conductive pads.

The solder resist layer 214 covers the lower surface of the core layer 210. The solder resist layer 214 has openings 214A for connection to the lower substrate 100. The conductive pads 211 are exposed in the openings 214A. The solder resist layer 215 covers the upper surface of the core layer 210. The solder resist layer 215 has openings 215A for external connection. The conductive pads 212 are exposed in the openings 215A. The conductive pads 212 are used to mount electronic components such as semiconductor devices, passive devices, or other interconnect substrates to the upper substrate 200.

The semiconductor apparatus 10 has a plurality of bonding members 20 for bonding the conductive pads 124A of the lower substrate 100 and the conductive pads 211 of the upper substrate 200 together. Each of the bonding members 20 includes, for example, a copper core ball 21 and a solder layer 22 covering the surface of the copper core ball 21. The bonding members 20 may be solder balls with copper cores, for example. Each of the bonding members 20 may include a columnar metal member and a solder layer covering the surface thereof. The metal may be copper. The columnar member may be a circular cylinder, a prism, or the like. The surface of the columnar member may have an Ni layer formed thereon.

The conductive pad 124A of the lower substrate 100 and the conductive pad 211 of the upper substrate 200 are arranged in opposing relationship. The copper core ball 21 is in contact with both the conductive pad 124A and the conductive pad 211. The shape of the copper core ball 21 may be spherical or ellipsoidal. An Ni layer may be formed on the surface of the copper core balls 21.

The solder layer 22 may be in contact with both the conductive pad 124A and the conductive pad 211. The material of the solder layer 22 is, for example, a Pb (lead) free solder that is based on Sn, Sn—Ag, Sn—Cu, or Sn—Ag—Cu.

Figure 2:
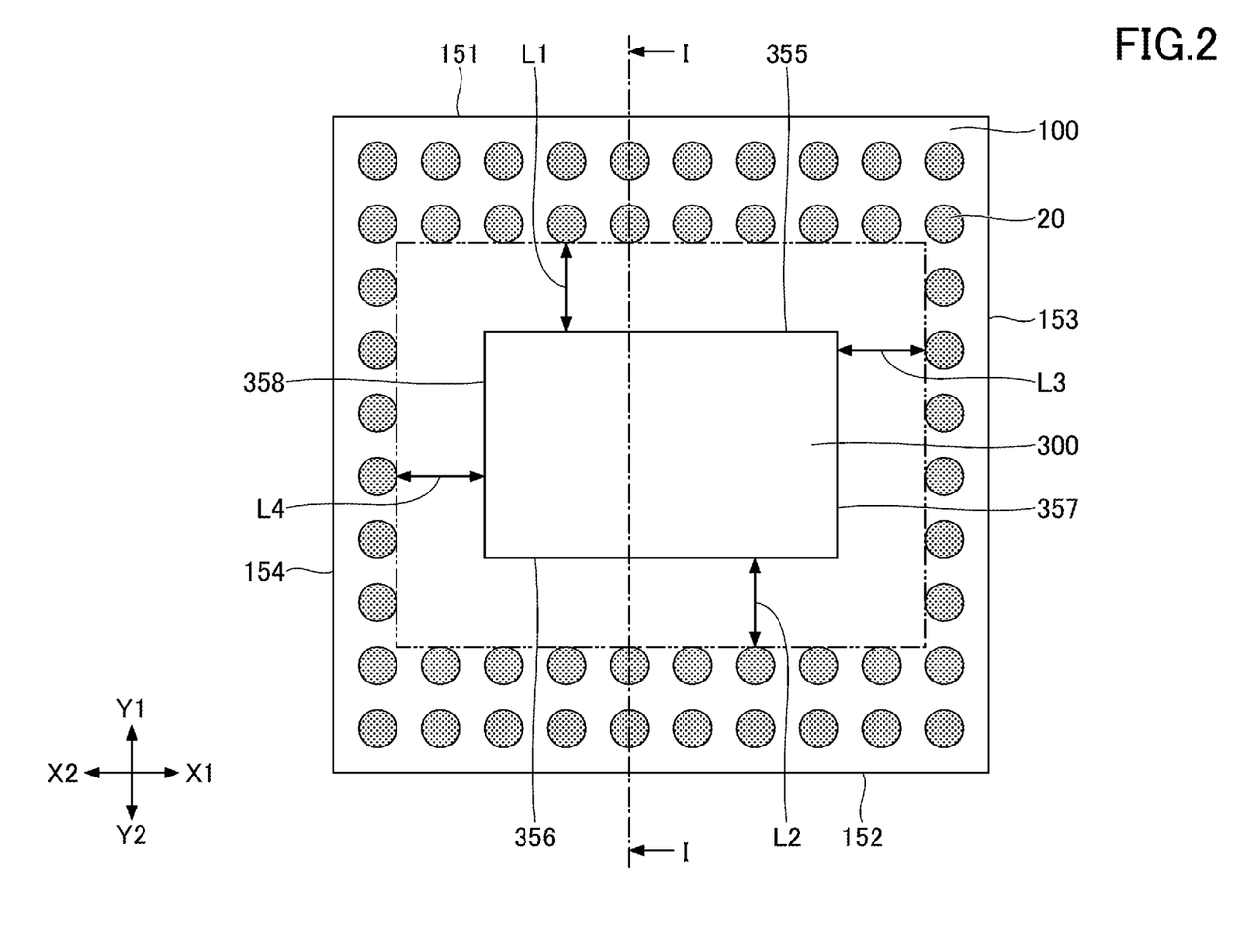
FIG. 2 is a drawing illustrating the arrangement of bonding members on a lower substrate according to the embodiment.

In the following, the arrangement of the bonding members 20 will be described in detail. FIG. 2 is a drawing illustrating the arrangement of the bonding members on the lower substrate according to the embodiment. A cross-section taken along the line I-I in FIG. 2 corresponds to FIG. 1.

The lower substrate 100 has a plane shape with a first side 151 and a second side 152 extending parallel to the X1-X2 direction and a third side 153 and a fourth side 154 extending parallel to the Y1-Y2 direction in the plan view. The first side 151 is situated on the Y1 side of the second side 152, and the second side 152 is situated on the Y2 side of the first side 151. The third side 153 is situated on the X1 side of the fourth side 154, and the fourth side 154 is situated on the X2 side of the third side 153. The length of the third side 153 and the fourth side 154 is, for example, 0.95 to 1.05 times the length of the first side 151 and the second side 152. The plane shape of the lower substrate 100 may be a square shape. Namely, the length of the third side 153 and the fourth side 154 may be equal to the length of the first side 151 and the second side 152.

The semiconductor device 300 has a plane shape with a fifth side 355 and a sixth side 356 extending parallel to the X1-X2 direction and a seventh side 357 and an eighth side 358 extending parallel to the Y1-Y2 direction in the plan view. The fifth side 355 is situated on the Y1 side of the sixth side 356, and the sixth side 356 is situated on the Y2 side of the fifth side 355. The seventh side 357 is situated on the X1 side of the eighth side 358, and the eighth side 358 is situated on the X2 side of the seventh side 357. The fifth side 355 is closer to the first side 151 than is the sixth side 356, and the sixth side 356 is closer to the second side 152 than is the fifth side 355. The seventh side 357 is closer to the third side 153 than is the eighth side 358, and the eighth side 358 is closer to the fourth side 154 than is the seventh side 357. The fifth side 355 and the sixth side 356 are longer than the seventh side 357 and the eighth side 358.

In the plan view, the semiconductor device 300 is disposed approximately at the center of the lower substrate 100. The bonding members 20 are regularly arranged around the perimeter of the semiconductor device 300. Part of the bonding members 20 are arranged between the first side 151 and the fifth side 355 in two rows, referred to as first rows, extending parallel to the X1-X2 direction, and part of the bonding members 20 are arranged between the second side 152 and the sixth side 356 in two rows, referred to as second rows, extending parallel to the X1-X2 direction. Further, part of the bonding members 20 are arranged between the third side 153 and the seventh side 357 in a row, referred to as the third row, extending parallel to the Y1-Y2 direction, and part of the bonding members 20 are arranged between the fourth side 154 and the eighth side 358 in a row, referred to as the fourth row, extending parallel to the Y1-Y2 direction. As described above, the present embodiment is such that the number of rows in the third row and the number of rows in the fourth row are less than the number of rows in the first rows and the number of rows in the second rows.

The conductive pads 124A of the lower substrate 100 and the conductive pads 211 of the upper substrate 200 are also regularly arranged around the perimeter of the semiconductor device 300 in the plan view, such as to correspond in position to the bonding members 20.

A mold resin 40 fills the gap between the upper substrate 200 and the lower substrate 100, so that the upper substrate 200 is secured to the lower substrate 100. The distance between the upper substrate 200 and the lower substrate 100 is maintained by the copper core ball 21.

In the following, a description will be given of a method of making the semiconductor apparatus 10 according to the embodiment. FIG. 3 through FIG. 8 are cross-sectional views illustrating the method of making the semiconductor apparatus 10 according to the embodiment.

Figure 3:
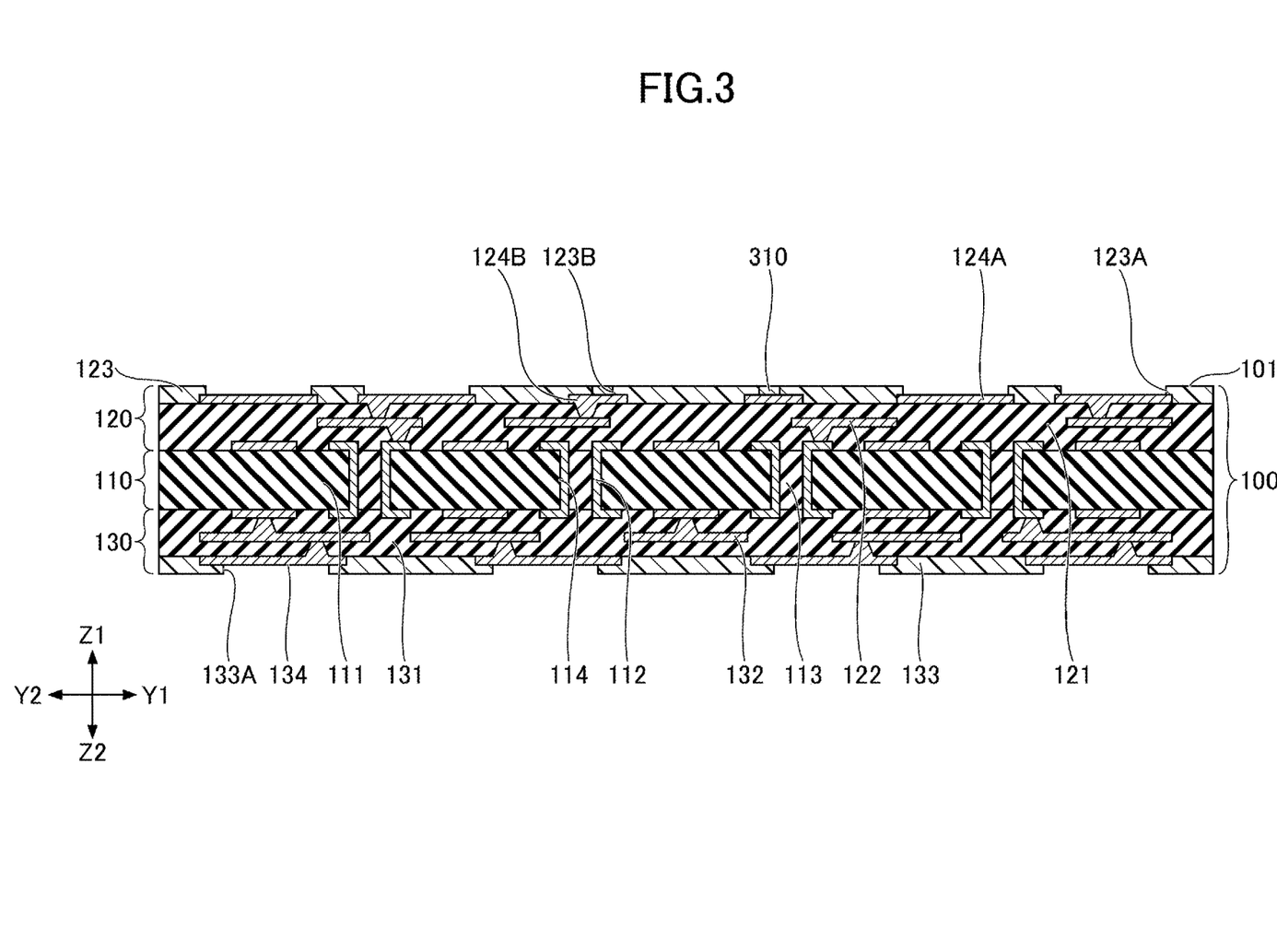
FIG. 3 is a cross-sectional view illustrating a method of making the semiconductor apparatus according to the embodiment.

As illustrated in FIG. 3, the lower substrate 100 is provided. As was previously described, the lower substrate 100 includes the conductive pads 124A, the conductive pads 124B, and the like. Subsequently, the bonding material 310, for example, is disposed on the conductive pads 124B. The bonding material 310 may be formed by electrolytic plating or the like.

Figure 4:
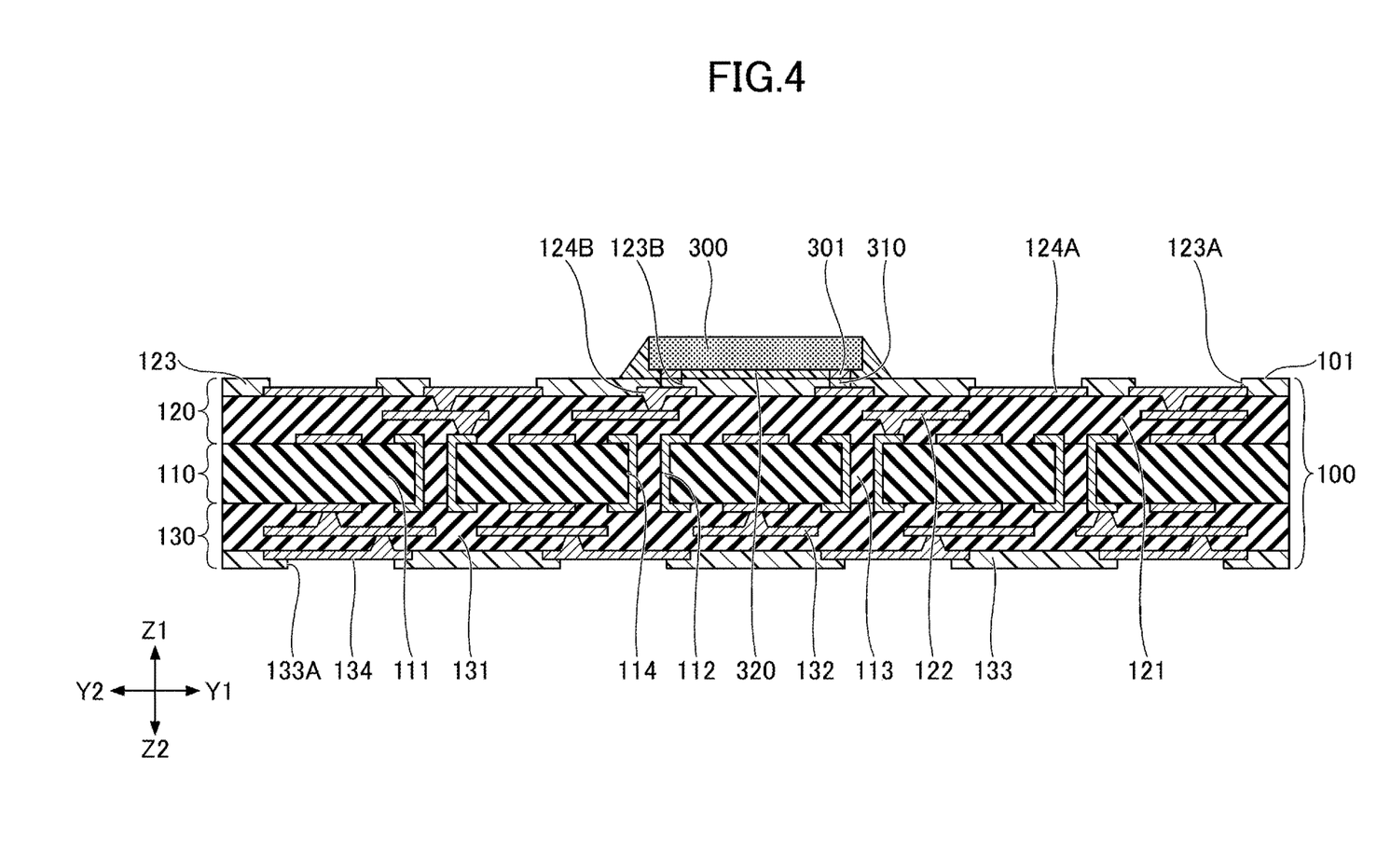
FIG. 4 is a cross-sectional view illustrating the method of making the semiconductor apparatus according to the embodiment.

As illustrated in FIG. 4, the semiconductor device 300 having bumps 301 formed thereon is flip-chip mounted on the lower substrate 100. In other words, the bumps 301 are electrically connected to the conductive pads 124B of the lower substrate 100 via the bonding material 310. Thereafter, the underfill material 320 fills the gap between the semiconductor device 300 and the lower substrate 100. Alternatively, instead of providing the underfill material 320, the mold resin 40 may be used to fill the gap between the semiconductor device 300 and the lower substrate 100.

Figure 5:
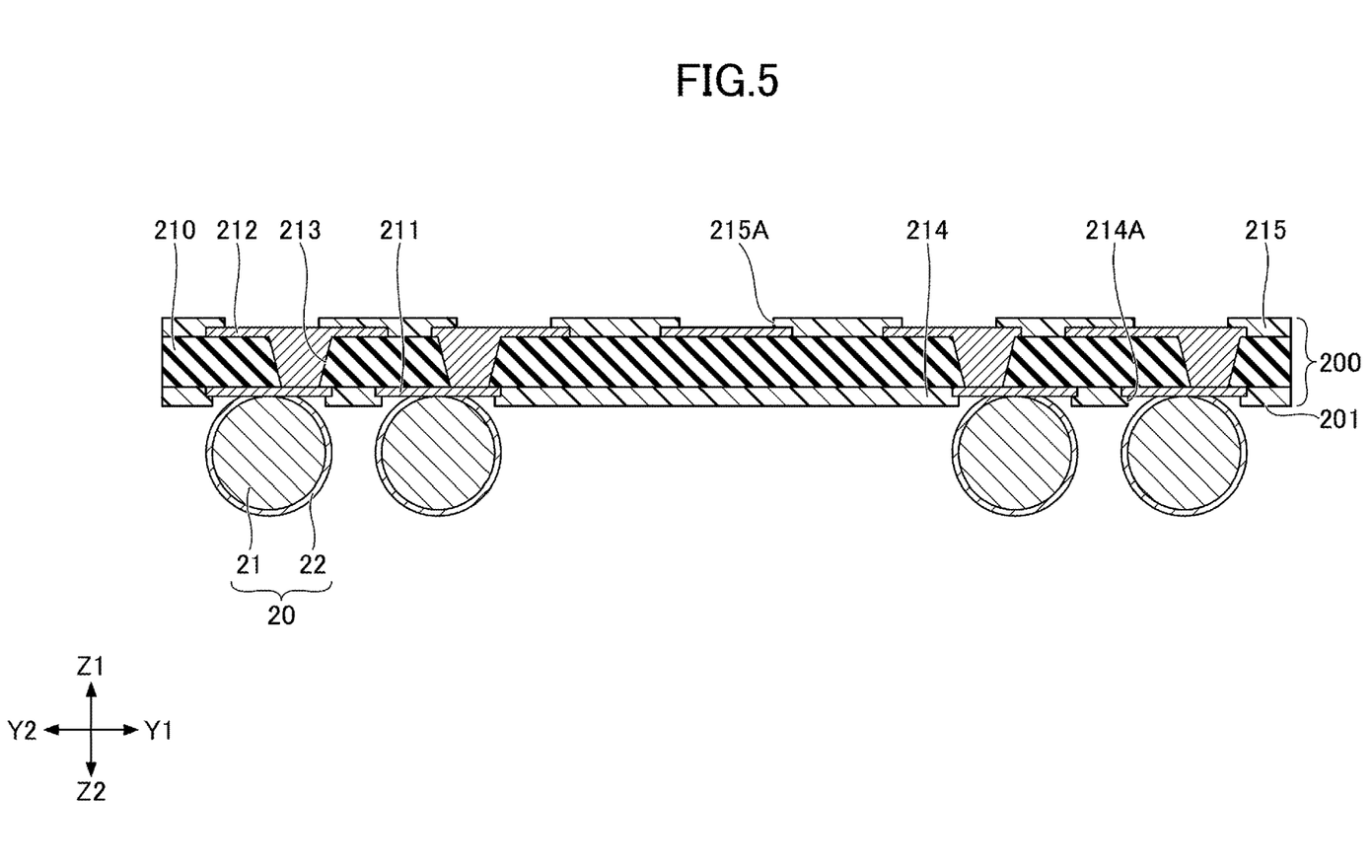
FIG. 5 is a cross-sectional view illustrating the method of making the semiconductor apparatus according to the embodiment.

As illustrated in FIG. 5, the upper substrate 200 is provided. As was previously described, the upper substrate 200 includes the conductive pads 211 and the like. Solder balls each with a copper core are then placed on the conductive pads 211 as the bonding members 20. Each of the bonding members 20 has a spherical copper core ball and a solder layer 22 disposed around the outer surface of the copper core ball 21. An Ni layer may be formed on the surface of the copper core balls 21.

Figure 6:
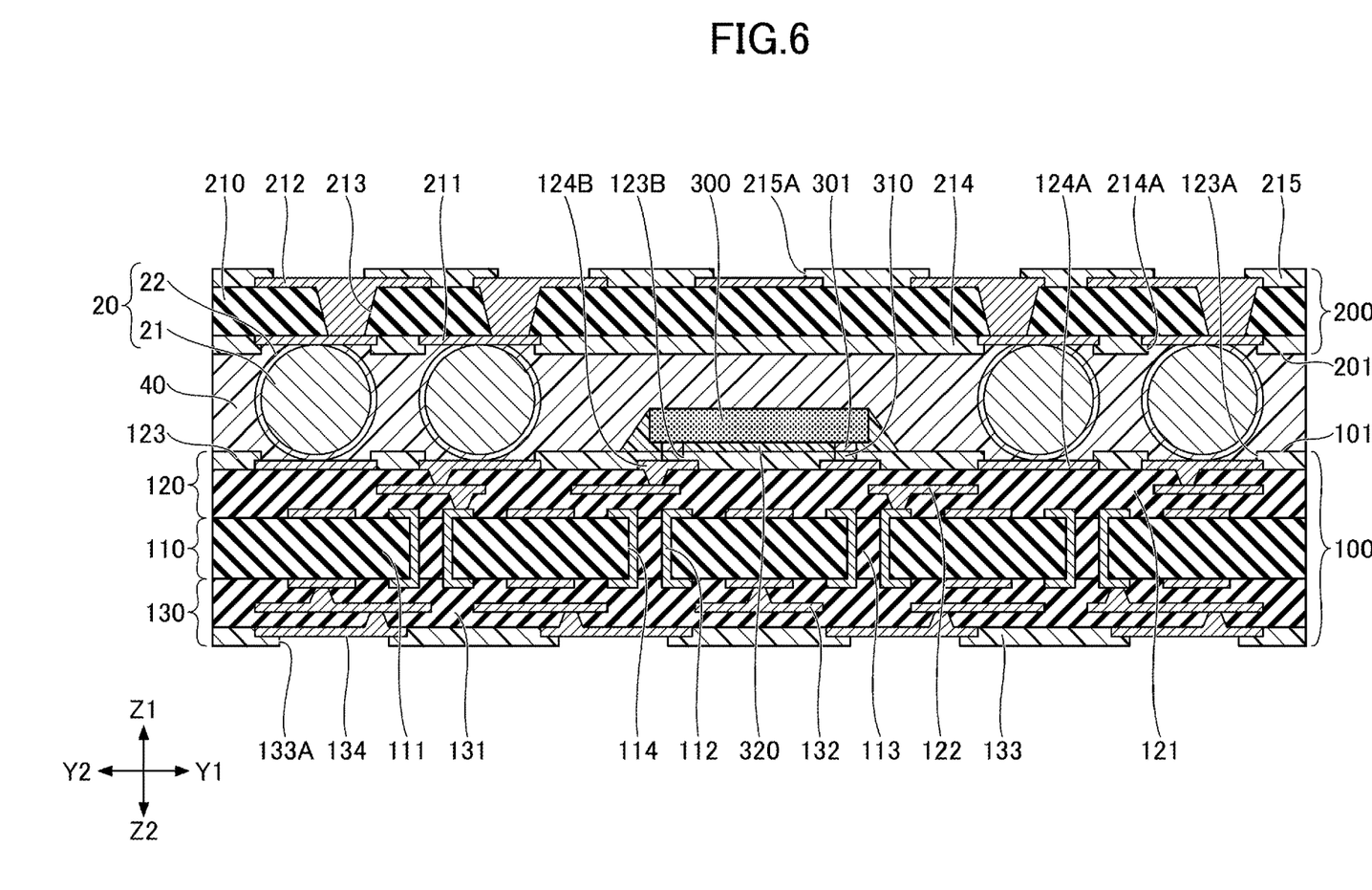
FIG. 6 is a cross-sectional view illustrating the method of making the semiconductor apparatus according to the embodiment.

After filling the gap between the semiconductor device 300 and the lower substrate 100 with the underfill material 320 and mounting the bonding members 20, the upper substrate 200 is placed on the lower substrate 100 such that the bonding members 20 are brought in contact with the conductive pads 124A, while the mold resin 40 is provided between the lower substrate 100 and the upper substrate 200, as illustrated in FIG. 6. The semiconductor device 300 is disposed between the lower substrate 100 and the upper substrate 200.

Figure 7:
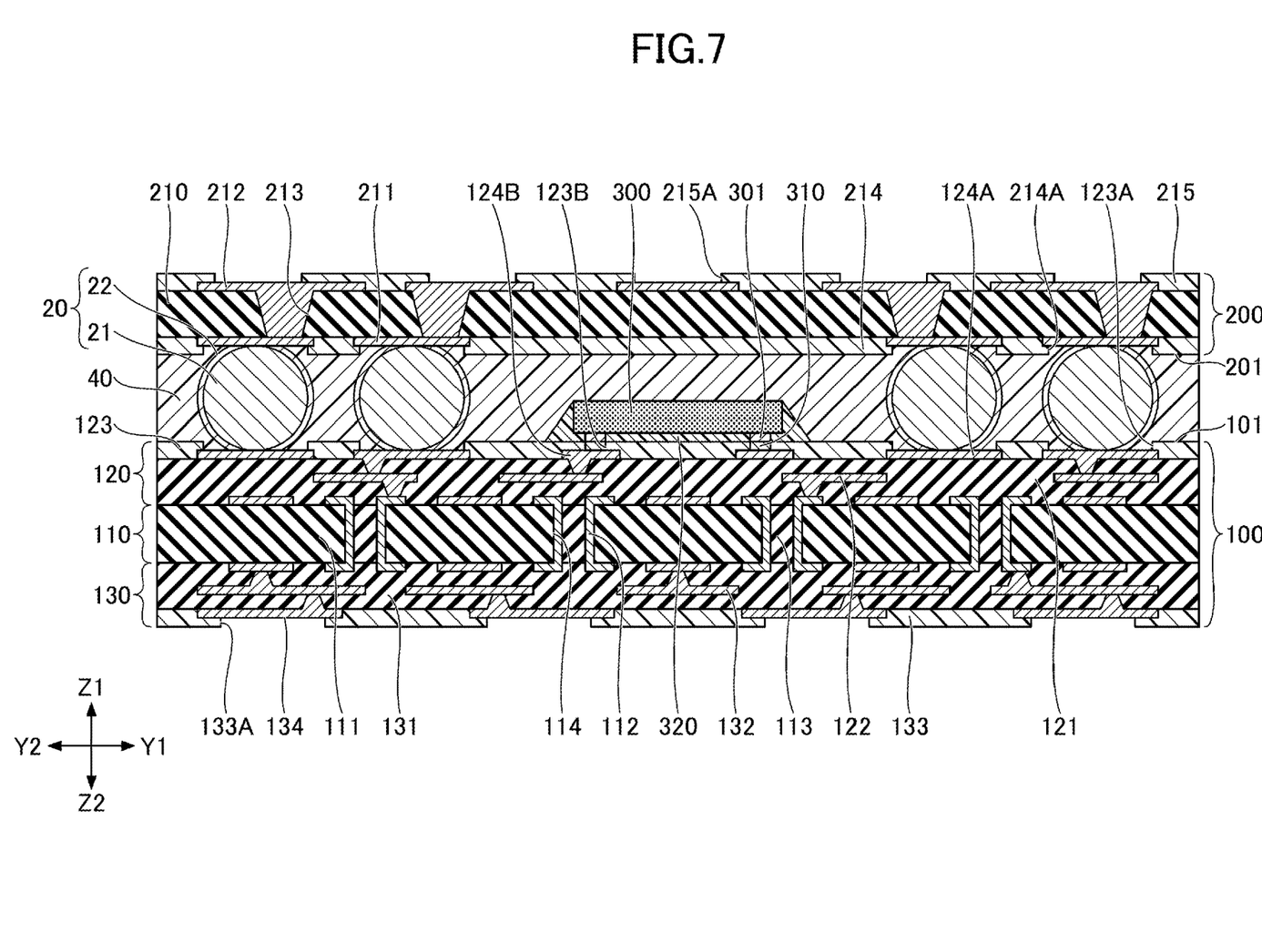
FIG. 7 is a cross-sectional view illustrating the method of making the semiconductor apparatus according to the embodiment.

The solder layers 22 are then reflowed. As a result, as illustrated in FIG. 7, the solder layers 22 melt and then solidify, so that the copper core balls 21 come in contact with the conductive pads 124A. An alloy layer (not shown) is also formed from the components of the solder layer 22 (e.g., tin), the components of the conductive pads 124A (e.g., copper), and the components of the conductive pads 211 (e.g., copper). The temperature of reflow is about 260 degrees Celsius, for example. The solder layers 22 may be melted by pressing a heated tool.

Figure 8:
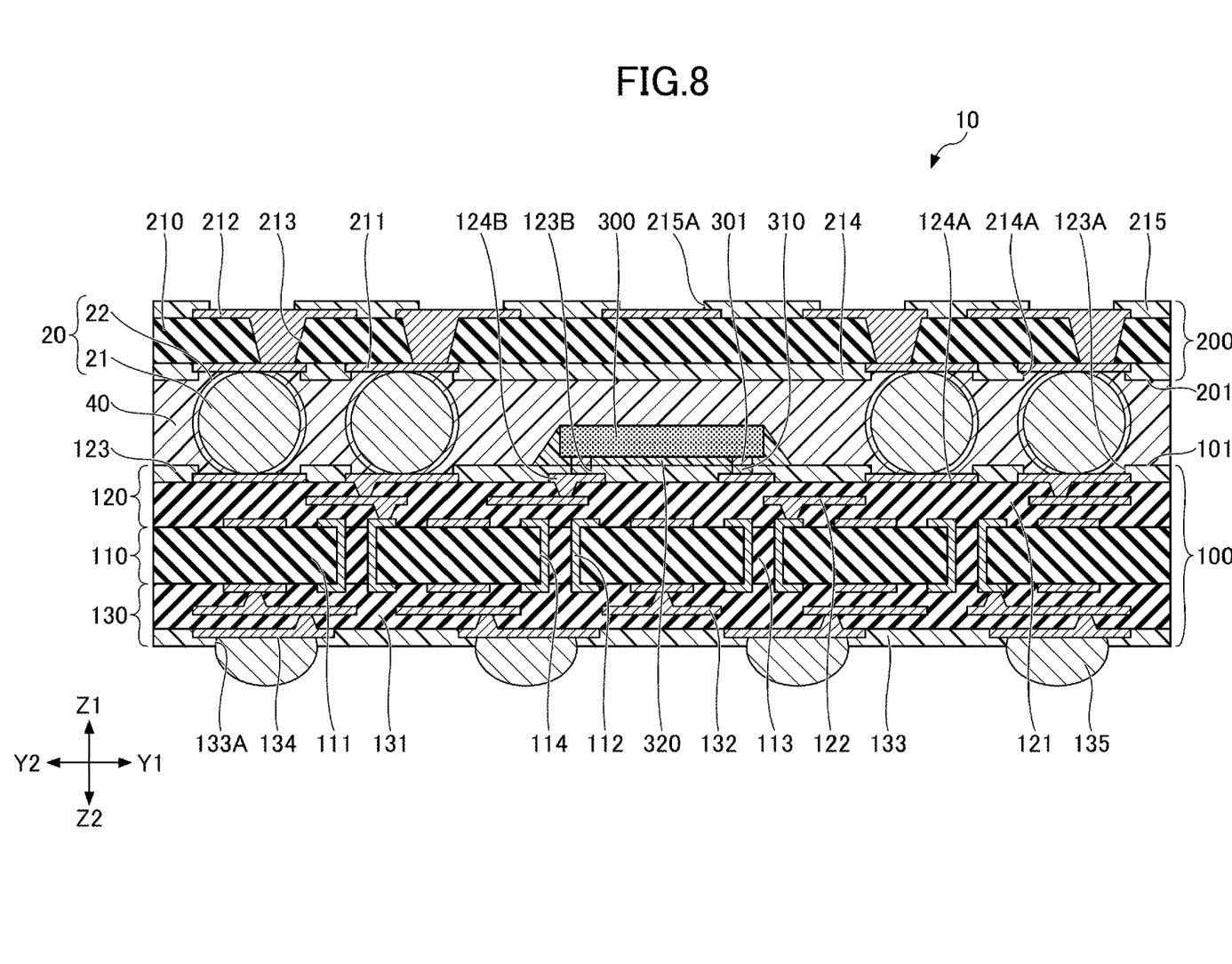
FIG. 8 is a cross-sectional view illustrating the method of making the semiconductor apparatus according to the embodiment.

As illustrated in FIG. 8, the solder balls 135 are formed on the conductive pads 134.

With this, the semiconductor apparatus 10 according to the embodiment is completed in final form.

The mold resin 40 may not be provided at the time of placing the upper substrate 200 on the lower substrate 100. The mold resin 40 may be provided after the solder layers 22 are reflowed. Further, the mold resin 40 may not be provided at the time of placing the upper substrate 200 on the lower substrate 100, and the mold resin 40 may be provided at the time of reflow of the solder layers 22.

Figure 9:
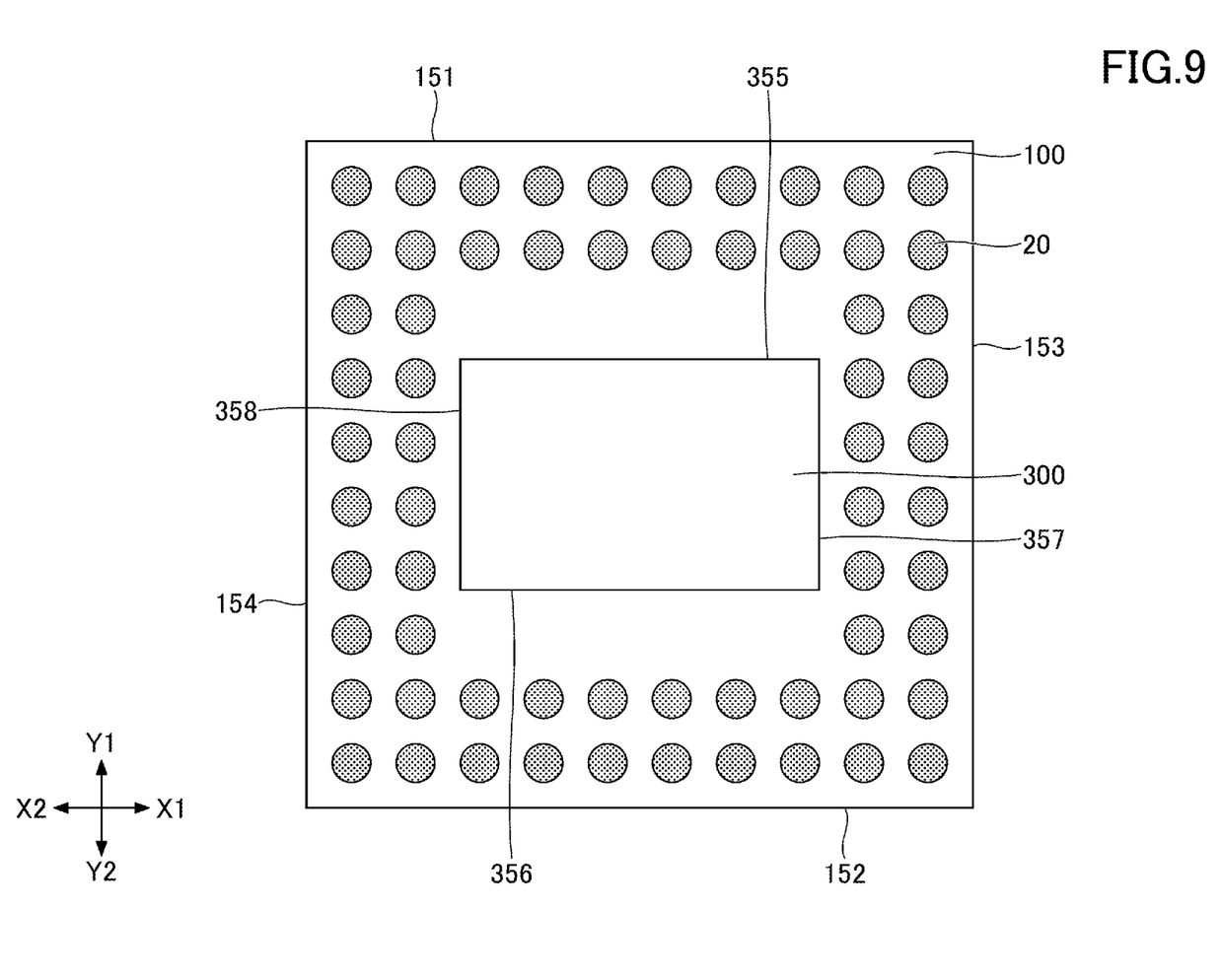
FIG. 9 is a drawing illustrating the arrangement of bonding members on a lower substrate in a comparative example.

In the following, the effects of the present embodiment will be discussed with reference to a comparative example. FIG. 9 is a drawing illustrating the arrangement of bonding members on a lower substrate in a comparative example.

In the comparative example, as illustrated in FIG. 9, part of the bonding members 20 are arranged between the third side 153 and the seventh side 357 in two rows, referred to as the third rows, extending parallel to the Y1-Y2 direction, and part of the bonding members 20 are arranged between the fourth side 154 and the eighth side 358 in two rows, referred to as the fourth rows, extending parallel to the Y1-Y2 direction. As described above, the comparative example is such that the number of rows in the third rows and the number of rows in the fourth rows are equal to the number of rows in the first rows and the number of rows in the second rows. The remaining configurations are substantially the same as the configurations of the present embodiment.

In both the present embodiment and the comparative example, the lower substrate 100 is thermally deformed at the time of reflow of the solder layers 22 or the like during manufacturing. After the solder layers 22 solidify, the thermal deformation of the lower substrate 100 is constrained by the upper substrate 200 through the bonding members 20.

Further, the semiconductor device 300 also thermally deforms. The coefficient of thermal expansion (CTE) of the semiconductor device 300 is significantly less than the coefficient of thermal expansion of the lower substrate 100. Because of this, the thermal deformation of semiconductor device 300 is significantly less than the thermal deformation of the lower substrate 100. The thermal deformation of the lower substrate 100 is thus also constrained by the semiconductor device 300.

In the comparative example, the number of rows in the third rows and the number of rows in the fourth rows are equal to the number of rows in the first rows and the number of rows in the second rows. As a result, the thermal deformation of the lower substrate 100 in the X1-X2 direction and the thermal deformation of the lower substrate 100 in the Y1-Y2 direction are equally constrained by the upper substrate 200. The fifth side 355 and the sixth side 356 of the semiconductor device 300 are longer than the seventh side 357 and the eighth side 358. Because of this, the thermal deformation of the lower substrate 100 in the X1-X2 direction is more constrained by the semiconductor device 300 than the thermal deformation of the lower substrate 100 in the Y1-Y2 direction. In the comparative example, thus, the lower substrate 100 is more easily thermally deformed in the X1-X2 direction than in the Y1-Y2 direction. Consequently, large anisotropy can occur in the thermal deformation of the lower substrate 100 in the XY plane. The greater the anisotropy of thermal deformation is, the more likely warping and waving will occur in the semiconductor apparatus.

In contrast, the present embodiment is configured such that the number of rows in the third row and the number of rows in the fourth row are less than the number of rows in the first rows and the number of rows in the second rows. Because of this, the thermal deformation of the lower substrate 100 in the Y1-Y2 direction is more constrained by the upper substrate 200 than the thermal deformation of the lower substrate 100 in the X1-X2 direction. Similarly to the comparative example, the thermal deformation of the lower substrate 100 in the X1-X2 direction is more constrained by the semiconductor device 300 than the thermal deformation of the lower substrate 100 in the Y1-Y2 direction. In the present embodiment, thus, the anisotropy of thermal deformation of the lower substrate 100 is reduced by the constraint on the thermal deformation of the lower substrate 100 by the upper substrate 200 and the constraint on the thermal deformation of the lower substrate 100 by the semiconductor device 300. This reduces the warping and waving of the semiconductor apparatus 10 caused by the anisotropy of thermal deformation of the lower substrate 100.

A first distance L1 between the fifth side 355 and the first rows of the bonding members 20 and a second distance L2 between the sixth side 356 and the second rows of the bonding members 20 are preferably less than or equal to 1.5 times a third distance L3 between the seventh side 357 and the third row of the bonding members 20, and are preferably less than or equal to 1.5 times a fourth distance L4 between the eighth side 358 and the fourth row of the bonding members 20. This is for the purpose of reducing the anisotropy of thermal contraction of the lower substrate 100. The first distance L1 and the second distance L2 are more preferably less than or equal to 1.3 times the third distance L3 and less than or equal to 1.3 times the fourth distance L4. The first distance L1 and the second distance L2 are yet more preferably less than or equal to 1.1 times the third distance L3 and less than or equal to 1.1 times the fourth distance L4.

Preferably, the bonding members 20 are regularly arranged in a matrix in the plan view. Nonetheless, there may be areas where the bonding members 20 are lacking due to constraints imposed by the routing of wires.

The numbers of rows in the first rows, the second rows, the third rows, and the fourth rows are not limited as long as the number of rows in the third row(s) and the number of rows in the fourth row(s) are less than the number of rows in the first rows and the number of rows in the second rows. For example, the number of rows in the third row and the number of rows in the fourth row may be one, and the number of rows in the first rows and the number of rows in the second rows may be three. As another example, the number of rows in the third rows and the number of rows in the fourth rows may be two, and the number of rows in the first rows and the number of rows in the second rows may be three. The numbers of rows in the first rows, the second rows, the third rows, and the fourth rows may be greater than these.

It is preferable that the direction of warping due to thermal deformation of the lower substrate 100 on which neither the semiconductor device 300 nor the bonding member 20 is provided be opposite to the direction of warping due to thermal deformation of the upper substrate 200 on which no bonding members 20 are provided. For example, when the lower substrate 100 warps such that the upper surface thereof becomes a convex surface, the upper substrate 200 preferably warps such that the upper surface thereof becomes a concave surface.

Although a description has been given with respect to preferred embodiments and the like, the present invention is not limited to these embodiments and the like, but various variations and modifications may be made to these embodiments and the like without departing from the scope of the present invention.

According to at least one embodiment, the occurrence of warping and waving can be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor apparatus, comprising:
    a first substrate having a first major surface and a plurality of first conductive pads on the first major surface;
    a second substrate having a second major surface opposing the first major surface, and having a plurality of second conductive pads on the second major surface;
    a semiconductor device disposed between the first substrate and the second substrate and mounted on the first major surface of the first substrate;
    a plurality of bonding members that bond the first conductive pads and the second conductive pads together; and a mold resin filling a gap between the first substrate and the second substrate, wherein in a plan view normal to the first major surface, the first substrate has a rectangular plane shape with a first side and a second side each extending parallel to a first direction, and a third side and a fourth side each extending parallel to a second direction perpendicular to the first direction, the semiconductor device has a rectangular plane shape with a fifth side and a sixth side each extending parallel to the first direction, and a seventh side and an eighth side each extending parallel to the second direction, the fifth side and the sixth side are longer than the seventh side and the eighth side, the fifth side is closer to the first side than is the sixth side, the seventh side is closer to the third side than is the eighth side, part of the bonding members are arranged in two or more first rows extending parallel to the first direction between the first side and the fifth side, part of the bonding members are arranged in two or more second rows extending parallel to the first direction between the second side and the sixth side, part of the bonding members are arranged in one or more third rows extending parallel to the second direction between the third side and the seventh side, part of the bonding members are arranged in one or more fourth rows extending parallel to the second direction between the fourth side and the eighth side, and a number of rows in the third rows and a number of rows in the fourth rows are each less than both a number of rows in the first rows and a number of rows in the second rows, wherein the bonding members each include a conductive core ball containing copper and a solder layer covering a surface of the conductive core ball, the conductive core ball being in direct physical contact with a corresponding one of the first conductive pads and a corresponding one of the second conductive pads, and wherein a first distance between the fifth side and the first rows and a second distance between the sixth side and the second rows are each less than or equal to 1.5 times a third distance between the seventh side and the third rows, and less than or equal to 1.5 times a fourth distance between the eighth side and the fourth rows.

2. The semiconductor apparatus as claimed in claim 1, wherein a length of the third side and the fourth side is 0.95 to 1.05 times a length of the first side and the second side.

3. The semiconductor apparatus as claimed in claim 1, wherein the number of rows in the third rows and the number of rows in the fourth rows are each greater than or equal to two.

* * * * *